United States Patent [19]

Masuda

[11] Patent Number: 4,919,624
[45] Date of Patent: Apr. 24, 1990

[54] CONNECTION TERMINAL STRUCTURE OF ELECTRONIC EQUIPMENT

[75] Inventor: Hitoshi Masuda, Tokyo, Japan
[73] Assignee: NEC Corporation, Japan
[21] Appl. No.: 357,360
[22] Filed: May 26, 1989
[30] Foreign Application Priority Data
   May 31, 1988 [JP] Japan .............................. 63-71981[U]
[51] Int. Cl.⁵ ........................ H01R 23/72; H05K 1/18
[52] U.S. Cl. .................................... 439/76; 361/399; 439/342
[58] Field of Search ..................... 439/55, 76, 78, 342; 429/96-100; 361/395, 399; 379/428, 429, 440

[56] References Cited
U.S. PATENT DOCUMENTS

| | | | |
|---|---|---|---|
| 3,627,930 | 12/1971 | Tolman | 379/429 |
| 4,120,022 | 10/1978 | Perkins et al. | 361/399 |
| 4,336,569 | 6/1982 | Tsuda et al. | 361/399 |
| 4,513,354 | 4/1985 | Abel | 361/395 |

Primary Examiner—Neil Abrams
Attorney, Agent, or Firm—Ostrolenk, Faber, Gerb & Soffen

[57] ABSTRACT

A connection terminal structure of a cordless telephone or similar electronic equipment to which an instrument having a connector is connectable for measuring electrical characteristics of the equipment, writing information in a storage built in the equipment, and other similar purposes. The equipment has a casing which includes a battery containing section. An opening is formed through the bottom of the battery containing section in the deepest portion of the latter, while conductive terminal members are provided on a printed circuit board which is mounted in the housing and are so positioned as to face the opening. When a cover closing the battery containing section is removed, the connector of the instrument may be inserted in the battery containing section. Contact pins provided on the connector are movable into and out of contact with the conductive terminal members on the printed circuit board via the slot.

9 Claims, 5 Drawing Sheets

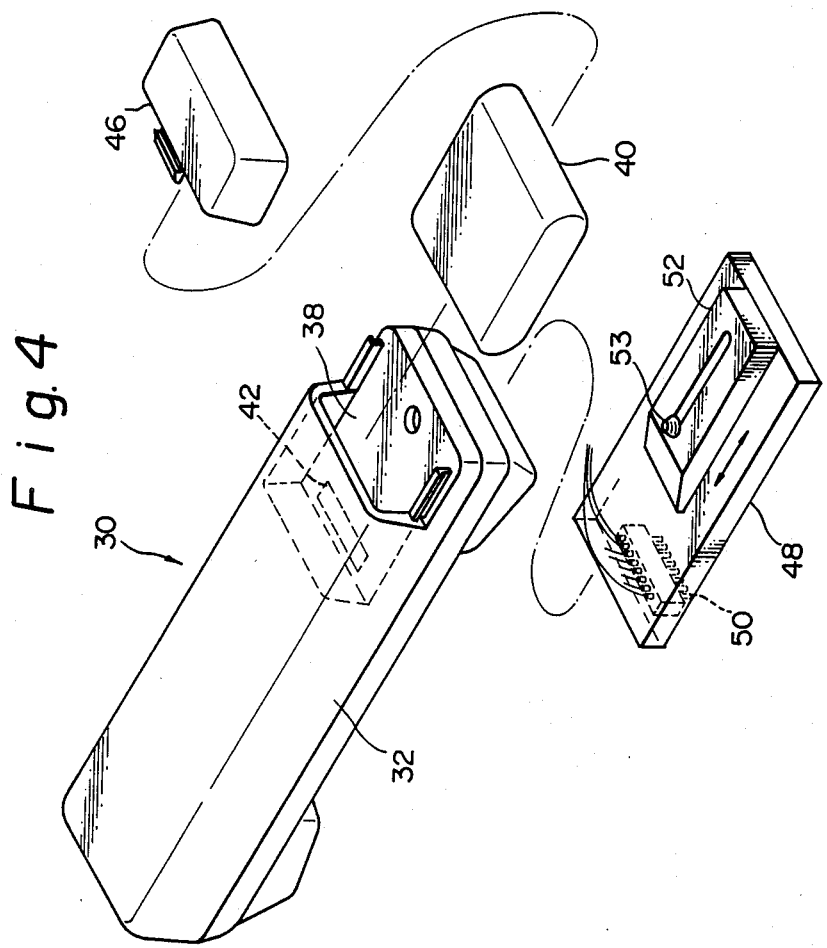

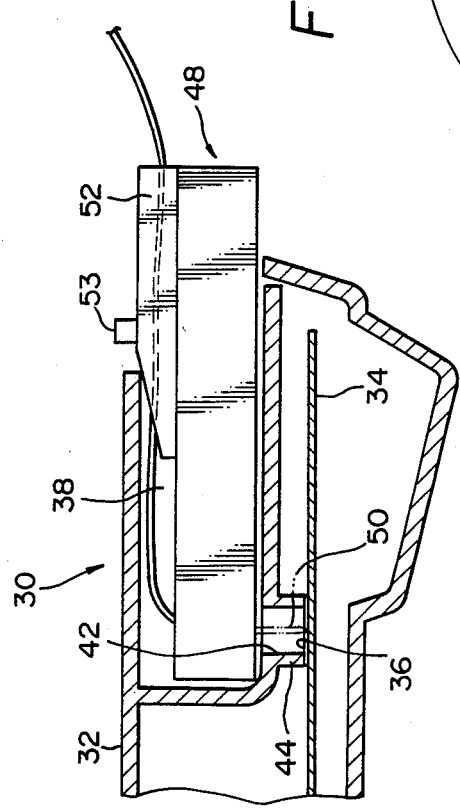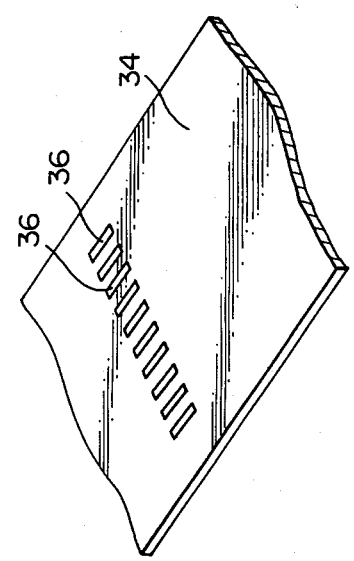

CONNECTION TERMINAL STRUCTURE OF ELECTRONIC EQUIPMENT

BACKGROUND OF THE INVENTION

The present invention relates to a cordless telephone or similar electronic equipment and, more particularly, to the structure of a connection terminal of such equipment which is available for various purposes such as for measuring electrical characteristics of the equipment and writing specific information in a storage which is built in the equipment.

In general, electronic equipment has an exclusive terminal in a part of its casing so that a desired instrument having a connector may be connected to the exclusive terminal for a particular purpose in the production line or in the event of maintenance. Typical of such an instrument is a gauge for measuring the electrical characteristics of equipment or a writer for wiring specific information in a storage which is built in equipment. It has been customary to provide such an exclusive connection terminal on a printed circuit board which is accommodated in the casing. A cover is removably mounted on the casing. When it is desired to mate the connector of the instrument to the connection terminal of the equipment, the cover is removed to expose the connection terminal to the outside of the casing. A problem with this kind of configuration is that although the uncovered connection terminal of the equipment may allow easy access of the connector of the instrument thereto, the circuitry printed on the circuit board is apt to short-circuit due to inadvertent contact resulting in the equipment practically failing or the information stored in the storage being destroyed. Further, removing the cover every time such an instrument is to be connected to the equipment is not efficient in the manipulation and maintenance aspect.

SUMMARY OF THE INVENTION

It is therefore an object of the present invention to eliminate the drawbacks particular to the prior art connection terminal structure of electronic equipment as discussed above.

It is another object of the present invention to provide a connection terminal structure of electronic equipment to which a desired instrument can be connected with ease for measuring electrical characteristics or for writing information in a storage, for example.

It is another object of the present invention to provide a connection terminal structure of electronic equipment which enhances efficient manipulation and maintenance.

It is another object of the present invention to provide a generally improved connection terminal structure of electronic equipment.

A connection terminal structure of electronic equipment having a casing, a printed circuit board mounted in the casing, and a battery containing section formed in the casing and having a battery inlet/outlet of the present invention comprises an opening formed through a part of the casing which constitutes a bottom wall of the battery containing section and being covered by another part of the casing which constitutes an upper wall of the battery containing section, and conductive terminal members provided on the printed circuit board which is spaced apart from the bottom wall by a predetermined distance and being so positioned as to face the opening.

BRIEF DESCRIPTION OF THE DRAWINGS

The above and other objects, features and advantages of the present invention will become more apparent from the following detailed description taken with the accompanying drawings in which:

FIG. 4 is a perspective view of electronic equipment having a connection terminal structure embodying the present invention;

FIG. 5B is a sectional side elevation showing the connection between the connection terminal and the connector; and FIG. 6 is a perspective view of a printed circuit board build in the equipment of FIG. 5.

DESCRIPTION OF THE PREFERRED EMBODIMENT

Figure 1:
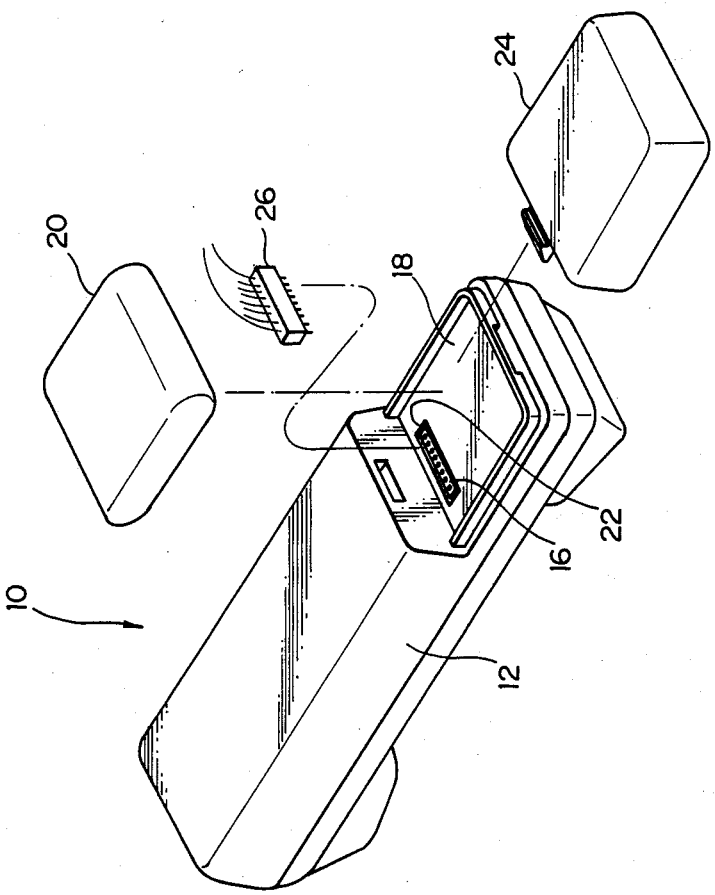
FIG. 1 is a perspective view showing a prior art cordless telephone which belongs to a family of electronic equipment to which the present invention pertains.
Figure 2:
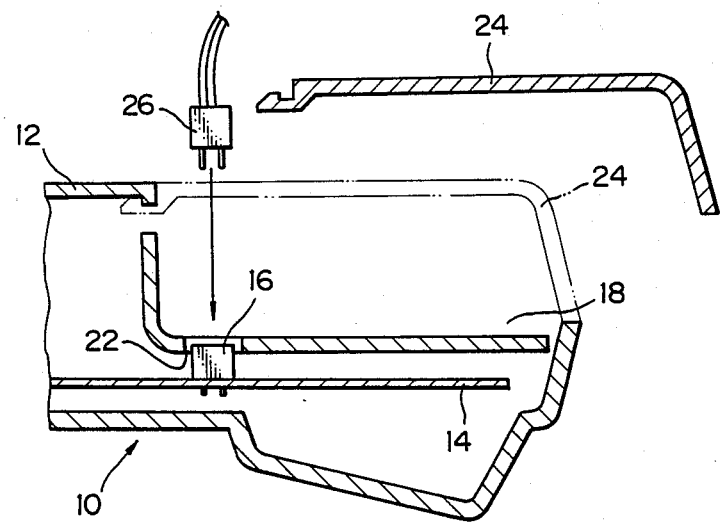
FIG. 2 is a sectional side elevation showing a specific arrangement of a connection terminal of the telephone shown in FIG. 1.

To better understand the present invention, a brief reference will be made to prior art electronic equipment such as a cordless telephone, shown in FIGS. 1 and 2. The cordless telephone, generally 10, has a casing 12 in which a printed circuit board 14 is mounted. A connector 16 is securely fitted on the printed circuit board 14 to serve as a connection terminal. The casing 12 has a battery containing section 18 for receiving a battery 20 therein. A slot 22 is formed through the bottom of the battery containing section 18 of the casing 12, while the connector 16 is so positioned on the printed circuit board 14 as to face the slot 22. A cover 24 usually covers the battery containing section 18 and is configured such that it uncovers the entire section 18 inclusive of the connector 16 when removed from the casing 12. When the cover 24 is so removed from the casing 12, a desired instrument such as a gauge or a writer may have its connector 26 brought into electrical connection with the connector 16 of the telephone 10. In this condition, however, the connector 16 is directly exposed to the outside through the slot 22 and uncovered battery storing section 18. This is apt to cause the circuitry provided on the printed circuit board 14 to short-circuit due to careless or unexpected contact, inviting a failure of the telephone 10 or the destruction of information stored in the telephone 10, as discussed earlier.

Figure 3:
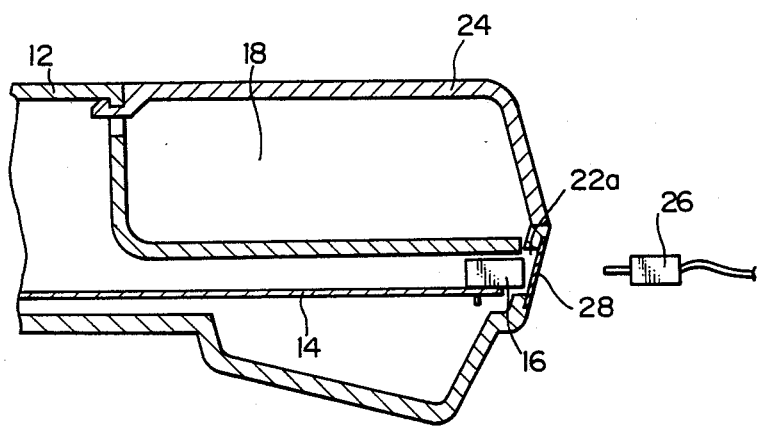
FIG. 3 is a view similar to FIG. 3, showing another specific arrangement of the connection terminal of the prior art cordless telephone.

FIG. 3 indicates another prior art connection terminal structure proposed to overcome the above-discussed shortcomings. In the figures, similar components or structural elements are designated by the same reference numerals, and redundant description will be avoided for simplicity. In FIG. 3, the connection terminal or connector 16 provided on the printed circuit board 14 of the casing 12 is so located as to face an opening 22a which is directly formed through a side wall of the casing 12. The connector 26 of the gauge, writer or similar instrument may be mated with the connector 16 on the printed circuit board 14 through the opening 22a. An ornamental closure member 28 is provided for closing the opening 22a except when the instrument is connected to the telephone 10. While this kind of scheme substantially eliminates the drawbacks of the configuration shown in FIG. 2, it needs extra structural parts and elements as well as extra production steps. Further, since the closure member 28 has to be removed in the event of maintenance, the manipulation and maintenance efficiency is poor.

Figure 5A:
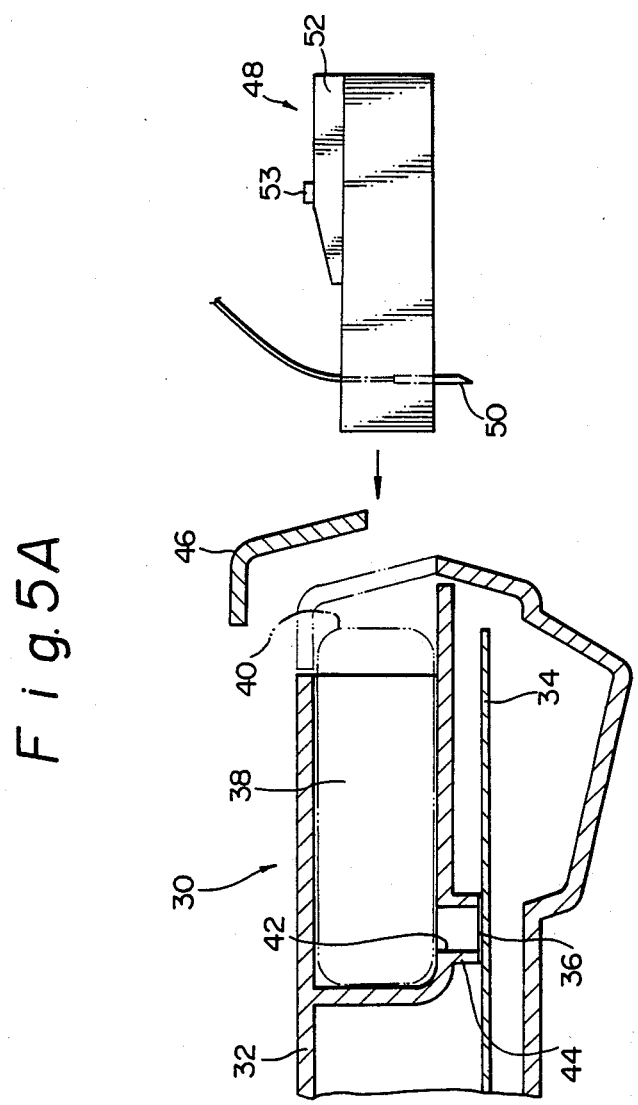
FIG. 5A is a sectional side elevation showing the connection terminal of the equipment shown in FIG. 4 and a connector which is provided on an instrument and connectable to the connection terminal.

Referring to FIG. 4, electronic equipment with a connection terminal arrangement embodying the present invention is shown together with a connector of a gauge, writer or similar instrument. Again, the electronic equipment is implemented as a cordless telephone for illustrative purpose. The cordless telephone of FIG. 4 will be described in detail with reference also made to FIGS. 5A, 5B and 6.

As shown, the cordless telephone, generally 30, has a casing 32 in which a printed circuit board 34 is mounted. As best shown in FIG. 6, conductive terminal members 36 are provided in a part of the surface of the printed circuit board 34 by arranging conductive films in a predetermined pattern. The casing 32 has a battery containing section 38 for receiving a battery 40 therein. The conductive terminal members 36 on the printed circuit board 34 face the deepest portion of the battery containing section 38. A slot 42 is formed through the bottom of the battery containing section 38 such that it lies just above the conductive terminal members 36. A sleeve 44 is formed integrally with the casing 32 and extends inward from the edges of the latter which define the slot 42. The tip of the sleeve 44 is held in contact with the printed circuit board 34. In this configuration, electronic parts and elements which are mounted on the printed circuit board 34 are physically isolated from the outside, except for the conductive terminal members 36. That is, only the conductive terminal members 36 are accessible through the slot 42. The casing 32 is so extended as to cover the slot 42 in the battery containing section 38, while a cover 46 for covering the battery containing section 38 is formed small enough to prevent the slot 42 from being directly exposed to the outside of the casing 32.

A gauge, writer or similar instrument (not shown) applicable to the telephone 30 has a connector 48. The connector 48 is shaped and dimensioned such that it can be inserted in the battery containing section 38 when the cover 46 is removed from the casing 32. Contact pins 50 are received in the connector 48 in such a manner as to be slidable up and down by the action of a spring (not shown). After the connector 48 of the instrument has been fully inserted in the battery containing section 38 of the casing 32, the contact pins 50 are slid downward into electrical contact with the conductive terminal members 36 of the printed circuit board 34 via the slot 42. It is to be noted that the contact pins 50 are individually electrically connected to the instrument (not shown).

As shown in FIG. 4, a slider 52 is mounted on the top of the connector 48 to form a part of the latter and is slidable in a direction in which the battery 40 may be inserted in the battery containing section 38. A screw 53 is provided for positioning the slider 52 at a suitable position. The connector 48 is inserted in the battery containing section 38 with the slider 52 being pulled away from the contact pins 50. After the contact pins 50 have been brought into the slot 42 as previously stated, the slider 52 is moved toward the contact pins 50 along the top of the connector 48 until its tip abuts against the upper inner periphery of the battery containing section 38. In this condition, the contact pins 50 are securely held in contact with their associated conductive terminal members 36.

When the instrument having the connector 48 is to be applied to the equipment 30 for a measuring purpose, for example, all that is required is removing the cover 46 and inserting the connector 48 in the battery containing section 48. Then, the slider 52 is positioned at the suitable position by the screw 53, as shown in FIG. 5B. As soon as the contact pins 50 are slid downward, they are brought into electrical connection with the printed circuit board 34 via the conductive terminal members 36. Of course, this applies not only to the measurement and other similar operations in the production stage of the equipment 30 but also to those which may be effected for maintenance. Although the conductive terminal members 36 are uncovered in the slot 42, they dot not show themselves directly to the outside of the casing 32 because the casing 32 extends over the slot 42 in the battery containing section 38. It follows that electrical connection to the conductive terminal members 36 is not available unless use is made of the connector 48, minimizing the chance of inadvertent contact with the conductive terminal members 36. Such an occurrence would short-circuit the circuitry on the printed circuit board 24 or disturb the stored information, as stated earlier.

In summary, in accordance with the present invention, electronic equipment has a casing including a battery containing section which is formed with a slot in the deepest portion thereof. Conductive terminal members are so positioned on a printed circuit board to face the slot. A connector of an instrument is inserted in the battery containing section by removing a cover, thereby causing contact pins of the connector into electrical connection with the conductive terminal members. The conductive terminal members, therefore, are prevented from being directly exposed to the outside of the casing, i.e., electrical connection to the conductive terminal members is enabled only when the connector is used. This eliminates the need for an ornamental closure member and other extra components as well as extra production steps associated therewith, while eliminating inadvertent connection to the conductive terminal members.

Various modifications will become possible for those skilled in the art after receiving the teachings of the present disclosure without departing from the scope thereof.

What is claimed is:

1. A connection terminal structure of electronic equipment having a casing, a printed circuit board mounted in said casing, and a battery containing section formed in said casing and having a battery inlet/outlet, comprising:

an opening formed through a part of the casing which constitutes a bottom wall of the battery containing section and being covered by another part of said casing which constitutes an upper wall of said battery containing section; and conductive terminal members provided on the printed circuit board which is spaced apart from said bottom wall by a predetermined distance and being so positioned as to face said opening.

2. A structure as claimed in claim 1, further comprising a connector having contact pins which are individually engageable with said conductive terminal members on the printed circuit board when said connector is inserted in the battery containing section via the battery inlet/outlet.

3. A structure as claimed in claim 2, wherein said conductive terminal members comprise conductive films which are arranged on the printed circuit board in a predetermined pattern.

4. A structure as claimed in claim 2, further comprising a sleeve formed integrally with a part of the housing which surrounds said opening and having a tip being held in contact with the printed circuit board to maintain said predetermined distance.

5. A structure as claimed in claim 2, further comprising a cover for closing the battery inlet/outlet of the battery containing section.

6. A structure as claimed in claim 2, wherein said contact pins of said connectors are slidable into and out of contact with said conductive terminal members.

7. A structure as claimed in claim 6, wherein said connector further comprises a slider for maintaining said contact pins in contact with said conductive terminal members.

8. A connection terminal structure of electronic equipment having a casing, a printed circuit board mounted in said casing, and a battery containing section formed in said casing and having a battery inlet/outlet, comprising:

an opening formed through a part of the casing which constitutes a bottom wall of the battery containing section and being covered by another part of said casing which constitutes an upper wall of said battery containing section; and conductive terminal members provided on the printed circuit board which is spaced apart from said bottom wall by a predetermined distance and being so positioned as to face said upper wall through an aperture provided on said bottom wall.

9. A connection terminal structure of electronic equipment having a casing, a printed circuit board mounted in said casing, and a battery containing section formed in said casing and having a battery inlet/outlet, comprising:

an opening formed through a part of the casing which constitutes a bottom wall of the battery containing section and being covered by another part of said casing which constitutes an upper wall of said battery containing section;

an aperture provided on the part of said bottom wall and facing said upper wall; and conductive terminal members provided on the printed circuit board which is spaced apart from said aperture on said bottom wall by a predetermined distance.

* * * * *